United States Patent
Lee et al.

(10) Patent No.: US 8,558,239 B2
(45) Date of Patent: Oct. 15, 2013

(54) ORGANIC LIGHT EMITTING DISPLAY DEVICE AND MANUFACTURING METHOD THEREOF

(75) Inventors: Yul-Kyu Lee, Yongin (KR); Chun-Gi You, Yongin (KR); Sun Park, Yongin (KR); Jong-Hyun Park, Yongin (KR); Jin-Hee Kang, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 212 days.

(21) Appl. No.: 12/904,672

(22) Filed: Oct. 14, 2010

(65) Prior Publication Data
US 2011/0108848 A1    May 12, 2011

(30) Foreign Application Priority Data
Nov. 11, 2009    (KR) .................. 10-2009-0108659

(51) Int. Cl.
*H01L 27/14* (2006.01)
(52) U.S. Cl.
USPC ............................................... 257/72; 438/34
(58) Field of Classification Search
USPC ............................................... 257/72; 438/34
See application file for complete search history.

(56) References Cited

U.S. PATENT DOCUMENTS

| 2003/0181002 | A1* | 9/2003 | Kim et al. ............ 438/200 |
| 2008/0218091 | A1* | 9/2008 | Jo et al. ............ 315/169.3 |
| 2009/0066236 | A1* | 3/2009 | Sung et al. ............ 313/504 |
| 2009/0223798 | A1 | 9/2009 | Miwa et al. |

FOREIGN PATENT DOCUMENTS

| JP | 2009218064 | | 9/2009 |
| JP | 2009231674 | | 10/2009 |
| KR | 20060028519 | A | 3/2006 |
| KR | 20060128445 | A | 12/2006 |
| KR | 20070011661 | A | 1/2007 |
| KR | 1020070077681 | | 7/2007 |
| KR | 1020080011826 | | 2/2008 |
| KR | 20080040373 | A | 5/2008 |

OTHER PUBLICATIONS

Korean Notice of Allowance issued on Jan. 30, 2012 in connection with Korean Patent Application No. 10-2009-0108659 and Request for Entry of the Accompanying Office Action attached herewith.

* cited by examiner

*Primary Examiner* — Shaun Campbell
(74) *Attorney, Agent, or Firm* — Robert E. Bushnell, Esq.

(57) ABSTRACT

An organic light emitting display having an active layer of a thin film transistor formed on a substrate, a first conductive layer formed at an edge of the active layer, a first insulation layer formed on the substrate and the first conductive layer, a second conductive layer corresponding to a central area of the active layer formed on the first insulation layer, a fanout lower electrode separated a predetermined distance from the second conductive layer, a pixel electrode, a third conductive layer formed on the second conductive layer, a fanout upper electrode formed on the fanout lower electrode, a second insulation layer formed on the third conductive layer, the fanout upper electrode, and the pixel electrode, and source and drain electrodes contacting the pixel electrode and formed on the second insulation layer.

19 Claims, 11 Drawing Sheets

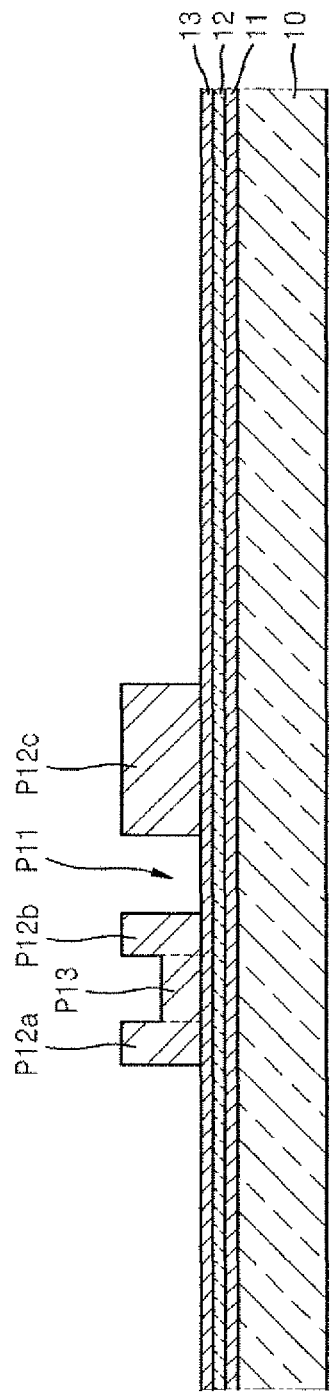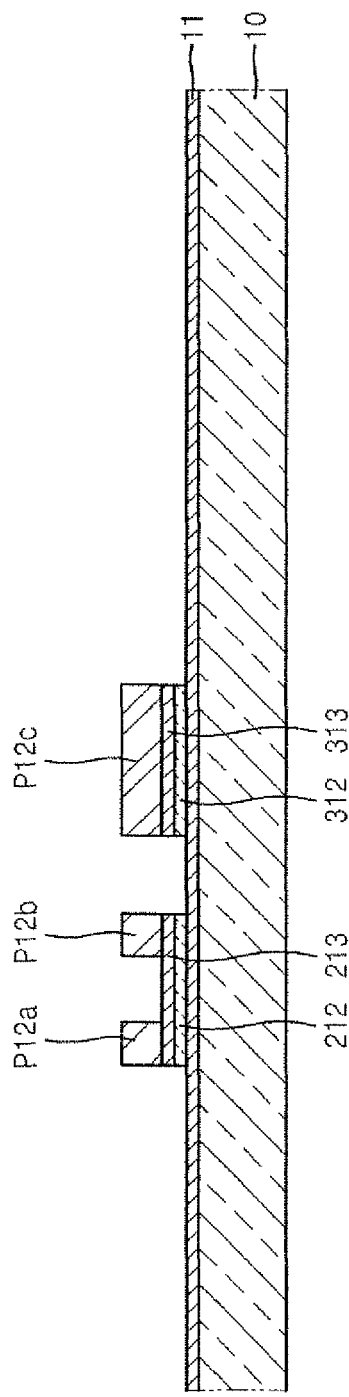

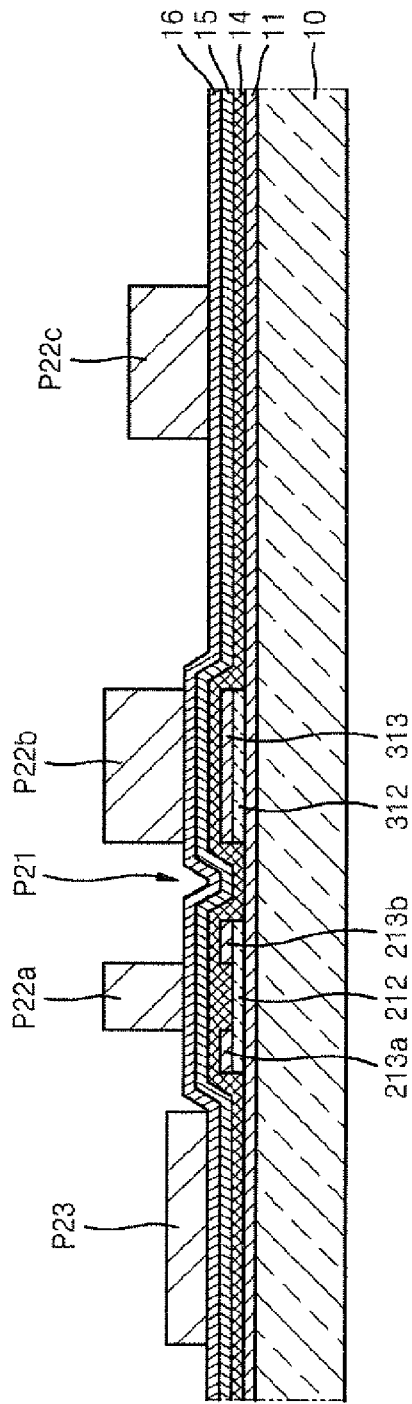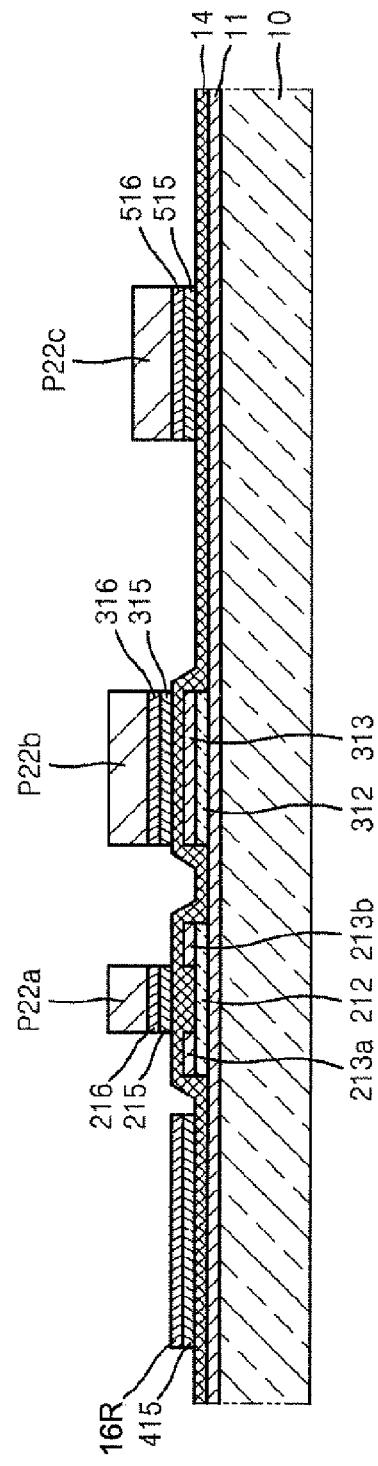

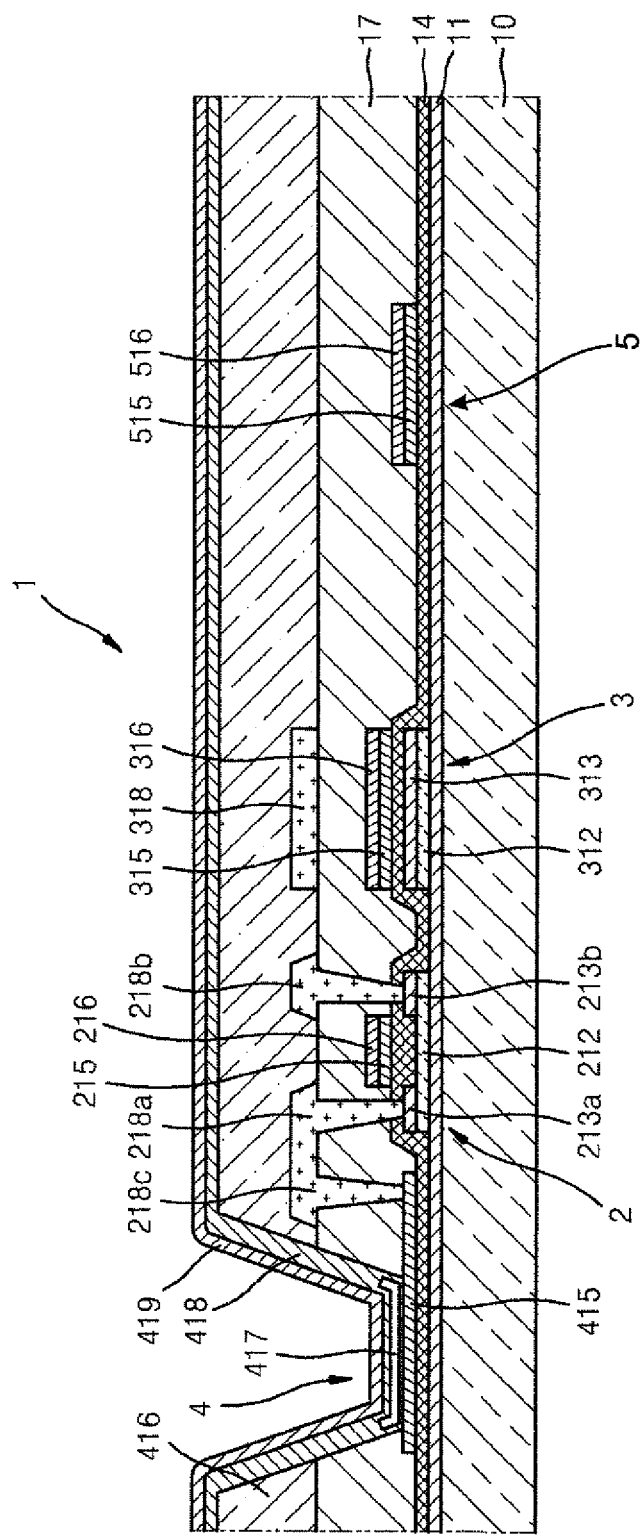

ORGANIC LIGHT EMITTING DISPLAY DEVICE AND MANUFACTURING METHOD THEREOF

CLAIM OF PRIORITY

This application makes reference to, incorporates the same herein, and claims all benefits accruing under 35 U.S.C §119 from an application entitled ORGANIC LIGHT EMITTING DISPLAY DEVICE AND MANUFACTURING METHOD THEREOF earlier filed in the Korean Industrial Property Office on Nov. 11, 2009, and there duly assigned Serial No. 10-2009-0108659 by that Office.

BACKGROUND OF THE INVENTION

1. Field of the Invention

The present invention relates to an organic light emitting display device and a manufacturing method thereof, and more particularly, to an organic light emitting display device having a simplified manufacturing process, and a manufacturing method thereof.

2. Description of the Related Art

Flat display devices such as organic light emitting display devices and liquid crystal display devices are manufactured on a substrate on which a pattern including thin film transistors (TFTs), capacitors, and wires connecting them is formed. In general, to form a pattern of a fine structure including the TFTs, the pattern is transferred to the substrate, on which the flat display device is manufactured, by using a mask having the fine pattern formed thereon.

A photolithography process is generally used as the process to transfer the pattern using the mask. According to the photolithography process, photoresist is uniformly coated on the substrate where the pattern is to be formed. The pattern on the mask is exposed to the photoresist by using an exposure apparatus such as a stepper. Then, (when the photoresist is positive photoresist,) the exposed photoresist is developed. Also, after the photoresist is developed, the pattern is etched by remaining photoresist which is used as a mask, thus removing unnecessary photoresist.

In the process to transfer the pattern using the mask, since a mask on which a necessary pattern is formed is prepared, as the number of processes using the mask increases, manufacturing costs for preparing the mask increases. Also, since the above-described complicated processes are needed, a manufacturing process is complicated and manufacturing time is prolonged so that the manufacturing cost may be increased.

SUMMARY OF THE INVENTION

To solve the above and/or other problems, the present invention provides an organic light emitting display device which may reduce a patterning process using a mask, and a manufacturing method thereof.

According to an aspect of the present invention, an organic light emitting display device includes an active layer of a thin film transistor formed on a substrate, a first conductive layer separately formed at an edge of the active layer, a first insulation layer formed on the substrate and the first conductive layer, a second conductive layer formed to correspond to a central area of the active layer with the first insulation layer interposed therebetween, a fanout lower electrode separated a predetermined distance from the second conductive layer and formed of the same material in the same layer as that of the second conductive layer, a pixel electrode separated a predetermined distance from the second conductive layer and formed of the same material in the same layer as that of the second conductive layer, a third conductive layer formed on the second conductive layer, a fanout upper electrode formed on the fanout lower electrode and formed of the same material in the same layer as that of the third conductive layer, a second insulation layer formed on the third conductive layer, the fanout upper electrode, and the pixel electrode, and source and drain electrodes contacting the pixel electrode and formed on the second insulation layer.

The organic light emitting display device may further include a first lower electrode of a capacitor separated from a predetermined distance from the active layer and formed of the same material in the same layer as that of the active layer, a first upper electrode formed on the first lower electrode of the capacitor and formed of the same material in the same layer as that of the first conductive layer, a second lower electrode formed on the first upper electrode of the capacitor and formed of the same material in the same layer as that of the second conductive layer, and a second upper electrode formed on the second lower electrode of the capacitor and formed of the same material in the same layer as that of the third conductive layer.

The second conductive layer may include at least one material selected from a group consisting of ITO (indium tin oxide), IZO (indium zinc oxide), ZnO (zinc oxide), and In2P3 (indium oxide).

The third conductive layer may include at least one material selected from a group consisting of Ag (silver), Mg (magnesium), Al (aluminum), Pt (platinum), Pd (palladium), Au (gold), Ni (nickel), Nd (neodymium), Ir (iridium), Cr (chromium), Li (lithium), Ca (calcium), Mo (molybdenum), Ti (tin), W (tungsten), MoW (molybdenum-tungsten), and Al/Cu (aluminum/copper).

The organic light emitting display device may further include a pixel define layer formed at an edge of the pixel electrode to have the pixel electrode exposed.

The active layer may be polycrystal silicon obtained by crystallizing amorphous silicon.

The first conductive layer may include impurity doped silicon.

End portions of the active layer and the first conductive layer may be arrayed on the same plane and end portions of the first lower electrode and the first upper electrode of the capacitor may be arrayed on the same plane.

End portions of the second conductive layer and the third conductive layer may be arrayed on the same plane, end portions of the lower electrode and the upper electrode of the fanout may be arrayed on the same plane, and end portions of the second lower electrode and the second upper electrode of the capacitor may be arrayed on the same plane.

The organic light emitting display device may further include, on the pixel electrode, an intermediate layer including a light emitting layer and an opposite electrode formed on the intermediate layer.

The thickness of the second insulation layer may be thicker than that of the first insulation layer.

According to another aspect of the present invention, a method of manufacturing an organic light emitting display device includes sequentially forming a semiconductor layer and a first conductive layer on and above a substrate and patterning the semiconductor layer and the first conductive layer into an active layer and source/drain areas of a thin film transistor, in a first mask process, forming a first insulation layer on a structure of the first mask process, sequentially forming a second conductive layer and a third conductive layer on and above the first insulation layer, and simultaneously patterning the first insulation layer, the second conductive layer, and the third conductive layer into a gate lower electrode and a gate upper electrode of the thin film transistor, a lower electrode and an upper electrode of a fanout, and a pixel electrode, in a second mask process, forming a second insulation layer on a structure of the second mask process and removing the second insulation layer to have part of the source/drain areas and part of the pixel electrode exposed, in a third mask process, forming a fourth conductive layer on a structure of the third mask process and patterning the fourth conductive layer into source/drain electrodes of the thin film transistor, in a fourth mask process, and forming a third insulation layer on a structure of the fourth mask process and removing the second insulation layer and the third insulation layer to have the pixel electrode exposed, in a fifth mask process.

In the first mask process, the first lower electrode and the first upper electrode of a capacitor may be simultaneously patterned with the active layer and the source/drain areas of the thin film transistor.

In the first mask process, a first half-tone mask including a semi-transmissive portion formed at a position corresponding to the central portion of the active layer may be used.

In the second mask process, the second lower electrode and the second upper electrode of a capacitor may be simultaneously patterned with the gate lower electrode and the gate upper electrode of the thin film transistor.

In the second mask process, a second half-tone mask including a semi-transmissive portion formed at a position corresponding to the pixel electrode may be used.

The method may further include sequentially forming an intermediate layer including a light emitting layer, and an opposite layer, on a structure of the fifth mask process.

The second conductive layer may include at least one material selected from a group consisting of ITO, IZO, ZnO, and In2O3.

The third conductive layer may include at least one material selected from a group consisting of Ag, Mg, Al, Pt, Pd, Au, Ni, Nd, Ir, Cr, Li, Ca, Mo, Ti, W, MoW, and Al/Cu.

The method may further include forming a buffer layer on the substrate.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein:

FIGS. 1-5 are cross-sectional views schematically illustrating the manufacturing process according to a first mask process of an organic light emitting display device according to an exemplary embodiment of the present invention;

FIGS. 6-9 are cross-sectional views schematically illustrating the manufacturing process according to a second mask process of an organic light emitting display device according to an exemplary embodiment of the present invention;

FIG. 16 is a cross-sectional view of an organic light emitting display device according to an exemplary embodiment of the present invention.

DETAILED DESCRIPTION OF THE INVENTION

Figure 1:
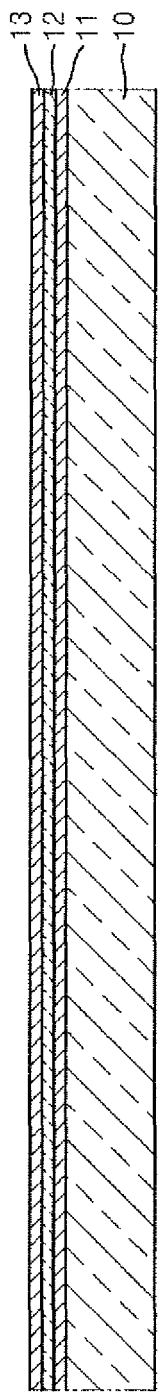

The attached drawings for illustrating exemplary embodiments of the present invention are referred to in order to gain a sufficient understanding of the present invention, the merits thereof, and the objectives accomplished by the implementation of the present invention. Hereinafter, the present invention will be described in detail by explaining exemplary embodiments of the invention with reference to the attached drawings. Like reference numerals in the drawings denote like elements.

FIGS. 1-15 are cross-sectional views schematically illustrating processes of manufacturing an organic light emitting display device 1 according to the present invention. FIG. 16 is a cross-sectional view of the organic light emitting display device 1 formed according to the above manufacturing processes.

Referring to FIG. 16, the organic light emitting display device 1 includes a substrate 10, a buffer layer 11, a thin film transistor (TFT) 2, a capacitor 3, an organic light emitting element 4, and a fanout 5. The substrate 10 may be formed of a transparent glass material having SiO2 as a main ingredient. Also, the substrate 10 may be formed of an opaque material or other materials such as a plastic material. However, for a bottom emission type organic light emitting display device in which an image is formed toward the substrate 10, the substrate 10 is formed of a transparent material.

The buffer layer 11 may be provided on an upper surface of the substrate 10 to facilitate the flatness of the substrate 10 and prevent the intrusion of impurity elements. The buffer layer 11 may be deposited by using SiO2 (silicon dioxide) and/or SiNx (silicon nitride) in a variety of deposition methods such as a plasma enhanced chemical vapor deposition (PECVD) method, an atmospheric pressure CVD (APCVD) method, and a low pressure CVD (LPCVD).

Referring to FIG. 1, a semiconductor layer 12 and a first conductive layer 13 are sequentially formed on and above the buffer layer 11. The semiconductor layer 12 may be formed of polycrystal silicon obtained by first depositing and crystallizing amorphous silicon. The amorphous silicon may be crystallized by a variety of methods such as a rapid thermal annealing (RTA) method, a solid phase crystallization (SPC) method, an excimer laser annealing (ELA) method, a metal induced crystallization (MIC) method, a metal induced lateral crystallization (MILC) method, and a sequential lateral solidification (SLS) method. The semiconductor layer 12 formed of polycrystal silicon obtained by crystallizing amorphous silicon is patterned to an active layer 212 of the TFT 2 and a first lower electrode 312 of the capacitor 3, which will be described later.

The first conductive layer 13 is deposited on the semiconductor layer 12. The first conductive layer 13 is patterned to form source/drain areas 213a and 213b of the TFT 2 or to a first upper electrode 313 of the capacitor 3 by depositing and thermally treating (crystallizing) amorphous silicon including N-type or P-type impurity.

Figure 2:
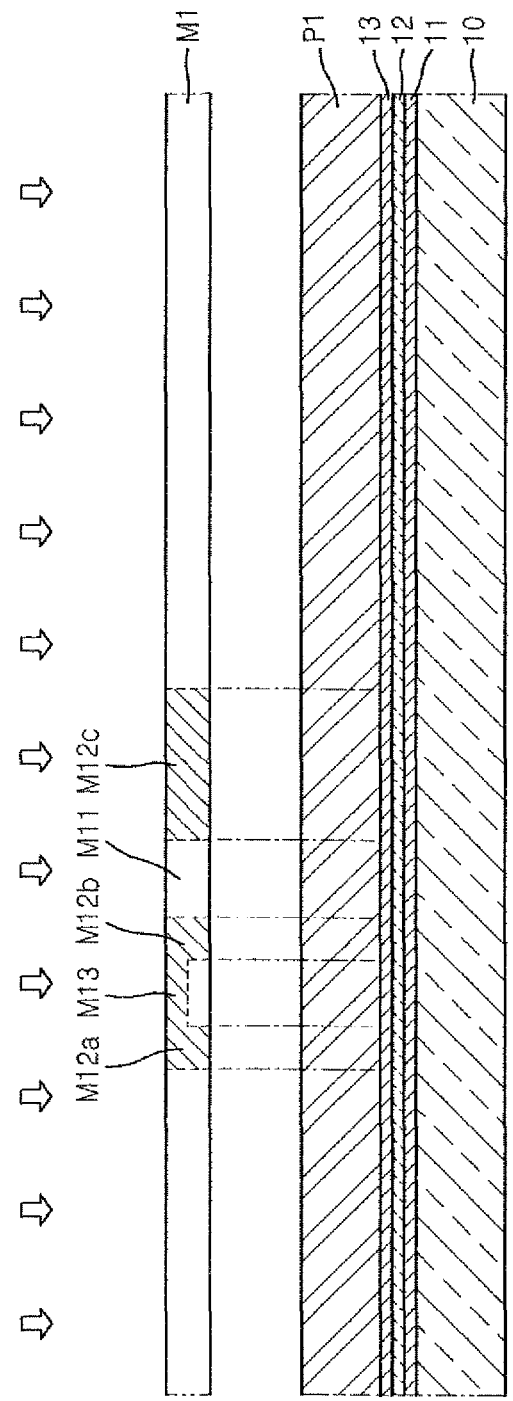

Referring to FIG. 2, a first photoresist layer P1 is formed by removing a solvent from the photoresist coated on an upper surface of a structure of FIG. 1, by pre-baking or soft baking. Then, a first mask M1 with a predetermined pattern is prepared and aligned to the substrate 10 to pattern the first photoresist layer P1.

The first mask M1 includes a first half-tone mask having a light transmissive portion M11, light shielding portions M12a, M12b, and M12c, and a semi-transmissive portion M13. The light transmissive portion M11 transmits light of a predetermined wavelength range, the light shielding portions M12a, M12b, and M12c shield light emitted thereon, and the semi-transmissive portion M13 transmits part of the light emitted thereon.

The first mask M1 illustrated in FIG. 2 is a conceptual mask for explaining the function of each part of the mask. Actually, the first mask M1 may be formed on a transparent substrate such as quartz Qz, as a predetermined pattern. The light shielding portions M12a, M12b, and M12c are formed by patterning a material such as chromium Cr or chromium (oxide) dioxide CrO2 on a quartz substrate. The semi-transmissive portion M13 may control the transmissivity of light emitted thereon by adjusting the composition ratio or thickness of components, by using at least one of materials such as Cr (chromium), Ir (iridium), Mo (molybdenum), Ta (tantalum), and Al (aluminum).

The first mask M1 with the above-described pattern is aligned to the substrate 10 and exposure is performed by emitting light of a predetermined wavelength range to the first photoresist layer P1.

Referring to FIG. 3, a pattern of a remaining photoresist layer is left after a developing process, to remove the first photoresist layer P1 of the exposed area, is performed. Although in the present embodiment a positive-PR is used so that an exposed area may be removed, the present invention is not limited thereto and thus a negative-PR may be used.

In FIG. 3, a photoresist layer portion P11 corresponding to the light transmissive portion M11 of the first mask M1 is removed, whereas photoresist layer portions P12a, P12b, and P12c respectively corresponding to the light shielding portions M12a, M12b, and M12c and a photoresist layer portion P13 corresponding to the semi-transmissive portion M13 are left. The thickness of the photoresist layer portion P13 corresponding to the semi-transmissive portion M13 is thinner than those of the photoresist layer portions P12a, P12b, and P12c corresponding to the light shielding portions M12a, M12b, and M12c. The thickness of the photoresist layer portion P13 may be adjusted by the composition ratio or thickness of a material forming the pattern of the semi-transmissive portion M13.

The semiconductor layer 12 and the first conductive layer 13 on and above the substrate 10 are etched by using an etching apparatus, using a pattern of the photoresist layer portions P12a, P12b, P12c, and P13 as a mask. A structure in the photoresist layer portion P11, where no photoresist layer is left, is first etched and the photoresist layer portions P12a, P12b, P12c, and P13 are partially etched. The etching process may be performed by a variety of methods such as a wet etching method or a dry etching method.

Referring to FIG. 4, while the first etching process is carried out, the semiconductor layer 12 and the first conductive layer 13 of the photoresist layer portion P11, where no photoresist layer is left, are etched. Although the photoresist layer portion P13 of FIG. 3 corresponding to the semi-transmissive portion M13 of FIG. 2 is etched, a lower structure thereof is left without change. The lower structure may be formed later into the active layer 212 and an electrode area 213 which will be used to create the source/drain areas 213a and 213b of the TFT 2, and the first lower electrode 312 and the first upper electrode 313 of the capacitor 3. The photoresist layer portions P12a, P12b, and P12c corresponding to the light shielding portions M12a, M12b, and M12c are partially left in spite of the first etching process, which are used as a mask in the second etching process.

Figure 5:
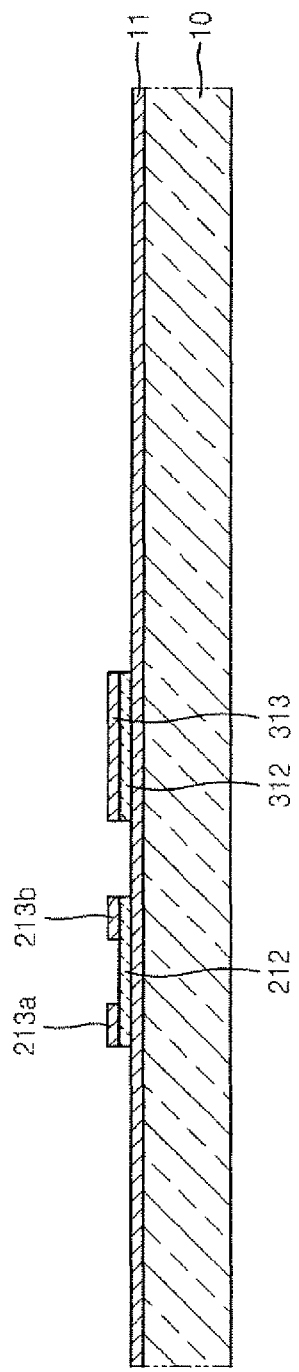

Referring to FIG. 5, the photoresist layer portions P12a, P12b, and P12c illustrated to be left in FIG. 4 are all etched after the second etching process. In particular, apart of the electrode area 213 under the area where the photoresist layer is partially removed, that is, between the photoresist layer portions P12a and P12b of FIG. 4, is etched so that the unetched area may be formed into the source/drain areas 213a and 213b of the TFT 2.

In FIG. 5, since the active layer 212 and the source/drain areas 213a and 213b of the TFT 2 and the first lower electrode 312 and the first upper electrode 313 of the capacitor 3 are simultaneously patterned on the same structure using the same single first mask M1, the active layer 212 of the TFT 2 and the first lower electrode 312 of the capacitor 3, and the source/drain areas 213a and 213b of the TFT 2 and the first upper electrode 313 of the capacitor 3, may be formed of the same material in the same layer, respectively.

Also, since the active layer 212 and the source/drain areas 213a and 213b of the TFT 2 and the first lower electrode 312 and the first upper electrode 313 of the capacitor 3 are simultaneously patterned by using the same single first mask M1, the shape of an end portion formed by each of the active layer 212 and the source/drain areas 213a and 213b of the TFT 2 and the shape of an end portion formed by each of the first lower electrode 312 and the first upper electrode 313 of the capacitor 3 are matched with each other.

Figure 6:
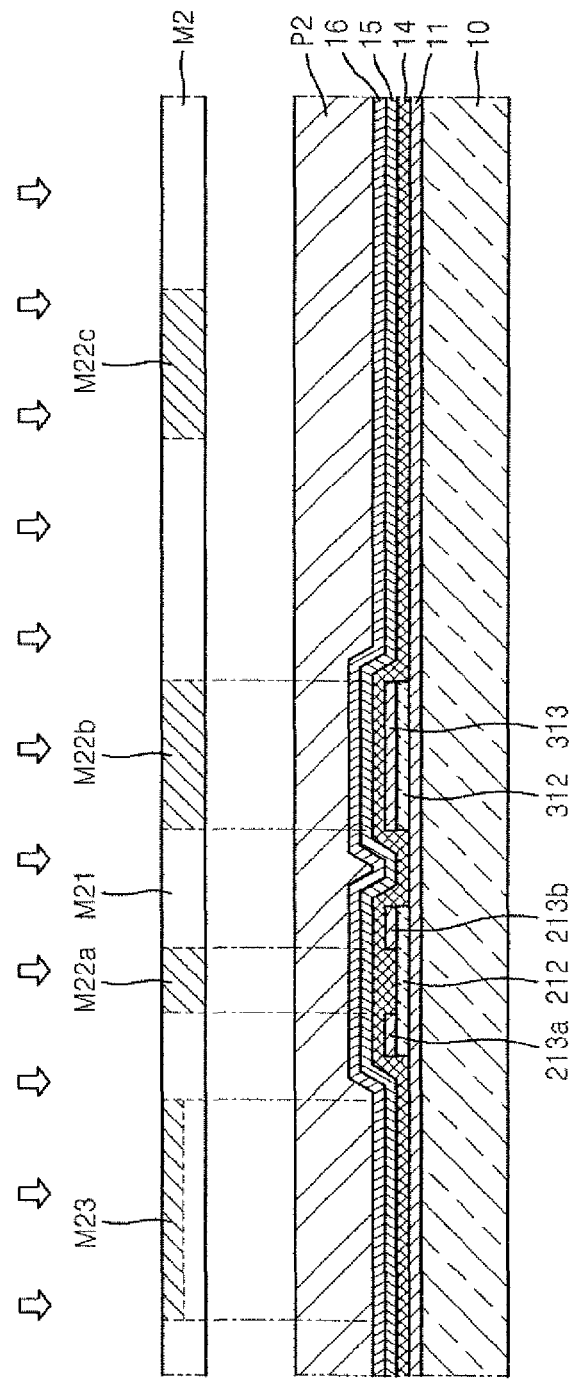

Referring to FIG. 6, a first insulation layer 14, a second conductive layer 15, and a third conductive layer 16 are sequentially deposited on and above the structure of FIG. 5 that is the resultant of a first mask process, and a second photoresist layer P2 is formed thereon and a second mask M2 is aligned to the substrate 10.

The first insulation layer 14 may be obtained by depositing an inorganic insulation layer such as SiNx or SiO2 in a method such as the PECVD method, the APCVD method, or the LPCVD method. The first insulation layer 14 is interposed between the active layer 212 and a gate lower electrode 215 of the TFT 2 that will be described later with respect to FIG. 8, to function as a gate insulation layer of the TFT 2, and simultaneously interposed between the first upper electrode 313 and a second lower electrode 315 of the capacitor 3 that will be described later with respect to FIG. 8, to function as a first dielectric layer of the capacitor 3.

The second conductive layer 15 may include at least one transparent material selected from a group consisting of ITO, IZO, ZnO, and In2P3. The second conductive layer 15 becomes parts of a pixel electrode 415 (FIG. 8) of the organic light emitting display device 1, the gate lower electrode 215 (FIG. 8) of the TFT 2, the second lower electrode 315 (FIG. 8) of the capacitor 3, and a lower electrode 515 (FIG. 8) of the fanout 5, which will be described later.

Although in the present embodiment the second conductive layer 15 is formed as a layer, the present invention is not limited thereto and the second conductive layer 15 may be formed of multilayered conductive materials. That is, when the pixel electrode 415 is formed of only a transparent material as in the present embodiment, the second conductive layer 15 may be used for a bottom emission type light emitting display device in which an image is formed toward the substrate 10. In contrast, for a front light emitting display device in which an image is formed toward the opposite side of the substrate 10, the second conductive layer 15 is formed into a multilayer. For example, a reflection layer may be formed by depositing a conductive material having a reflection property and then a transparent conductive material as in the present embodiment. Also, the second conducive layer 15 may be deposited in not only two layers but a multilayer as necessary.

The third conductive layer 16 may include at least one material selected from a group consisting of Ag, Mg, Al, Pt, Pd, Au, Ni, Nd, Ir, Cr, Li, Ca, Mo, Ti, W, MoW, and Al/Cu. The third conductive layer 16 may become parts of a gate upper electrode 216 (FIG. 8) of the TFT 2, a second upper electrode 316 (FIG. 8) of the capacitor 2, and an upper electrode 516 (FIG. 8) of the fanout 5, which will be described layer.

The second mask M2 is a half-tone mask having a light transmissive portion M21, light shielding portions M22a, M22b, and M22c, and a semi-transmissive portion M23. The light transmissive portion M21 transmits light of a predetermined wavelength range, the light shielding portions M22a, M22b, and M22c shield light emitted thereon, and the semi-transmissive portion M23 has a pattern corresponding to the pixel electrode 415. After the second mask M2 having the above pattern is aligned to the substrate 10, light of a predetermined wavelength range is emitted to the second photoresist layer P2.

Referring to FIGS. 6 and 7, a photoresist layer portion P21 corresponding to the light transmissive portion M21 of the second mask M2 is removed, whereas photoresist layer portions P22a, P22b, and P22c respectively corresponding to the light shielding portions M22a, M22b, and M22c and a photoresist layer portion P23 corresponding to the semi-transmissive portion M23 are left. The thickness of the photoresist layer portion P23 corresponding to the semi-transmissive portion M23 is thinner than those of the photoresist layer portions P22a, P22b, and P22c corresponding to the light shielding portions M22a, M22b, and M22c. The thickness of the photoresist layer portion P23 may be adjusted by the composition ratio or thickness of a material forming the pattern of the semi-transmissive portion M23.

The second conductive layer 15 and the third conductive layer 16 on and above the substrate 10 are etched by using an etching apparatus, using a pattern of the photoresist layer portions P22a, P22b, P22c, and P23 as a mask. A structure in the photoresist layer portion P21 where no photoresist layer is left is first etched and the photoresist layer portions P22a, P22b, P22c, and P23 are partially etched. The etching process may be performed by a variety of methods such as a wet etching method or a dry etching method.

Referring to FIG. 8, during the first etching process, the second and third conductive layers 15 and 16 of the photoresist layer portion P21 where no photoresist layer is left are etched. Although the photoresist layer portion P23 of FIG. 7 corresponding to the semi-transmissive portion M23 of FIG. 6 is etched, the pixel electrode 415 and a portion 16R of the third conductive layer 16 is left without change. The photoresist layer portions P22a, P22b, and P22c corresponding to the light shielding portions M22a, M22b, and M22c are partially left in spite of the first etching process, which are used as a mask in the second etching process.

Figure 9:
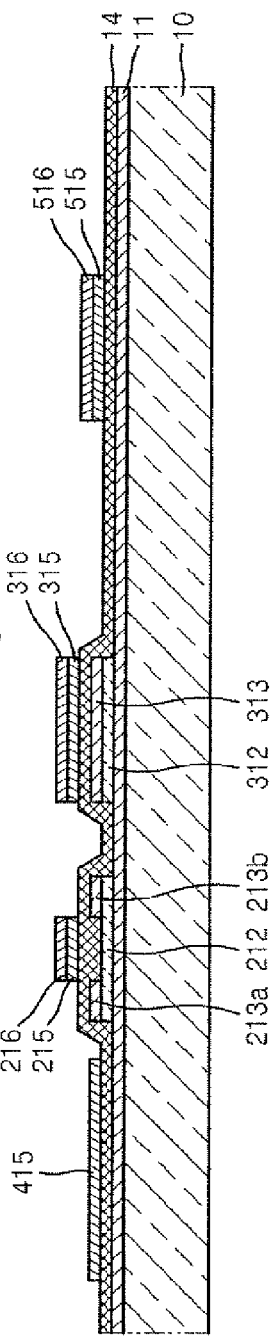

Referring to FIG. 9, the photoresist layer portions P22a, P22b, and P22c illustrated to be left in FIG. 8 are all etched after the second etching process. In particular, in the pixel electrode area where the photoresist layer is partially removed, the portion 16R of the third conductive layer 16 above the pixel electrode area is etched and part of the second conductive layer 15 is formed into the pixel electrode 415.

In FIG. 9, the pixel electrode 415, the gate lower and upper electrodes 215 and 216 of the TFT 2, the second lower and upper electrodes 315 and 316 of the capacitor 3, and the lower and upper electrodes 515 and 516 of the fanout 5 are simultaneously patterned on the same structure using the same single second mask M2. Accordingly, the pixel electrode 415, the gate lower electrode 215 of the TFT 2, the second lower electrode 315 of the capacitor 3, and the lower electrode 515 of the fanout 5, may be formed of the same material in the same layer. Also, the gate upper electrode 216 of the TFT 2, the second upper electrode 316 of the capacitor 3, and the upper electrode 516 of the fanout 5, may be formed of the same material in the same layer.

According to the organic light emitting display device 1 according to the present invention and a manufacturing method thereof, the fanout 5 is formed of the same material in the same layer as that of the gate lower and upper electrodes 215 and 216, which will be described in detail later.

Figure 10:
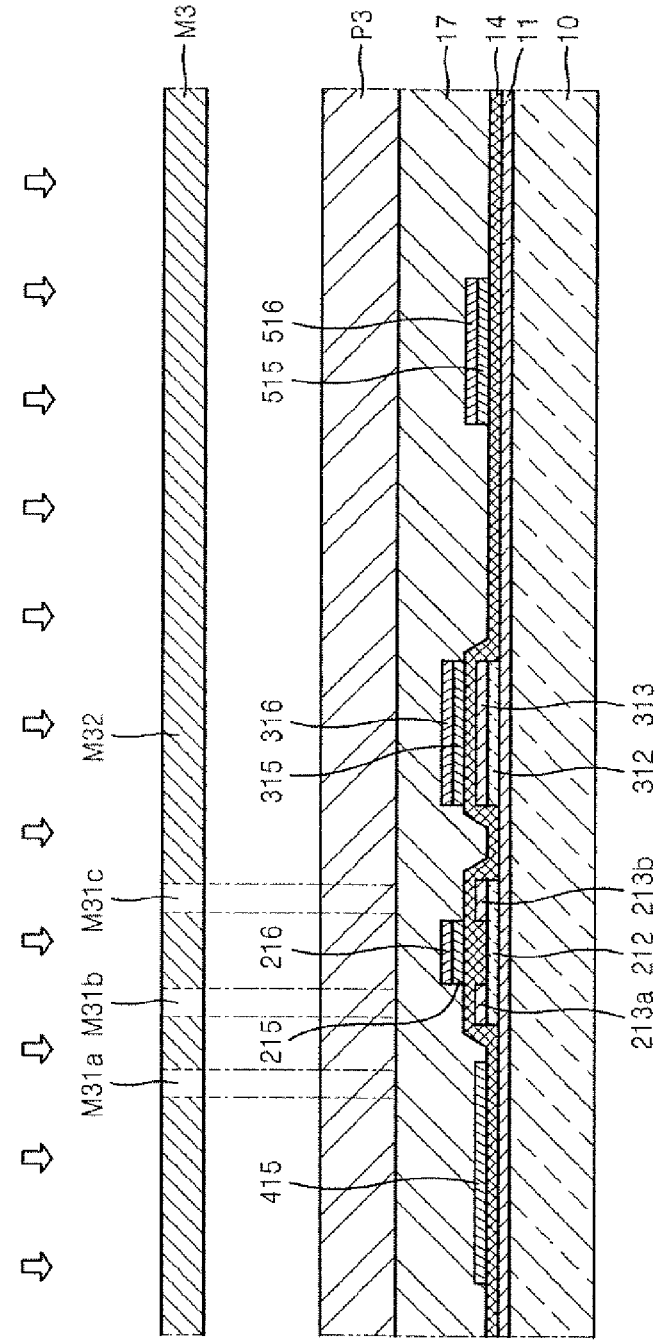
FIGS. 10 and 11 are cross-sectional views schematically illustrating the manufacturing process according to a third mask process of an organic light emitting display device according to an exemplary embodiment of the present invention.

Referring to FIG. 10, a second insulation layer 17 is formed on the structure of FIG. 9 that is a result of the second mask process. A third photoresist layer P3 is formed on the second insulation layer 17. A third mask M3 is aligned to the substrate 10.

Figure 13:
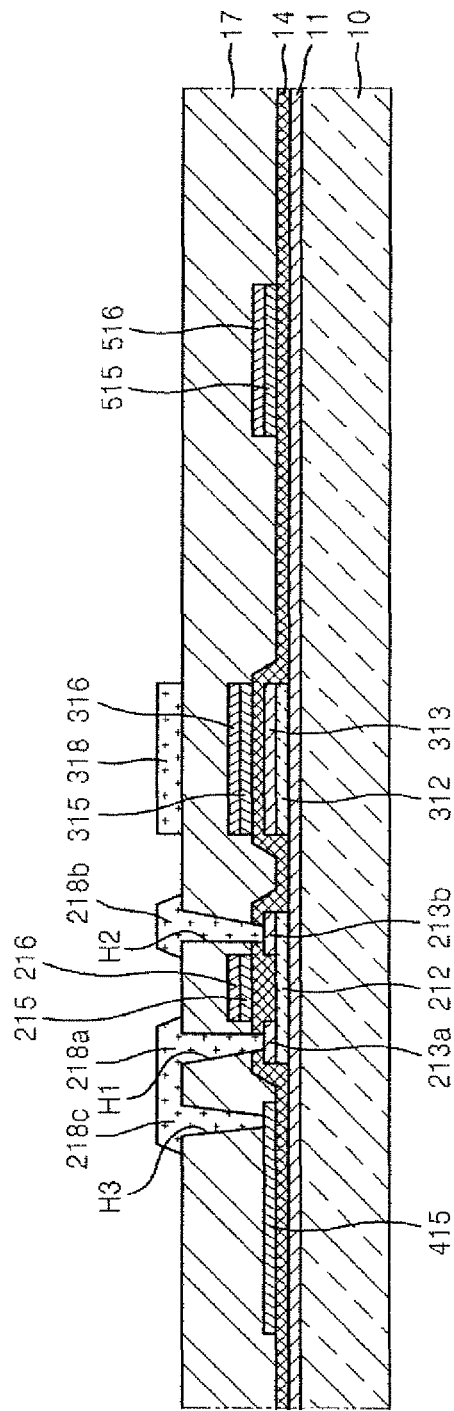

The second insulation layer 17 may be formed of at least one organic insulation material selected from a group consisting of polyimide, polyamide, acryl resin, benzocyclobutene, and phenol resin, by a spin coating method. The second insulation layer 17 is formed to have a sufficient thickness, for example, to be thicker than the first insulation layer 14, so as to function as an interlayer insulation layer between the gate lower and upper electrodes 215 and 216 and source/drain electrodes 218a and 218b of the TFT 2 (FIG. 13) and as a second dielectric layer between the second lower and upper electrodes 315 and 316 and a third electrode 318 of the capacitor 3 (FIG. 13). The second insulation layer 17 may be formed of not only the above organic insulation materials but the organic insulation material used for the first insulation layer 14, or by alternating an organic insulation material and an inorganic insulation material.

The third mask M3 has a pattern consisting of light transmissive portions M31a, M31b, and M31c respectively corresponding to a part of the pixel electrode 415 and parts of the source/drain areas 213a and 213b, and a light shielding portion M32. The third mask M3 having the above pattern is aligned to the substrate 10 and exposure is performed on the third photoresist layer P3.

Figure 11:
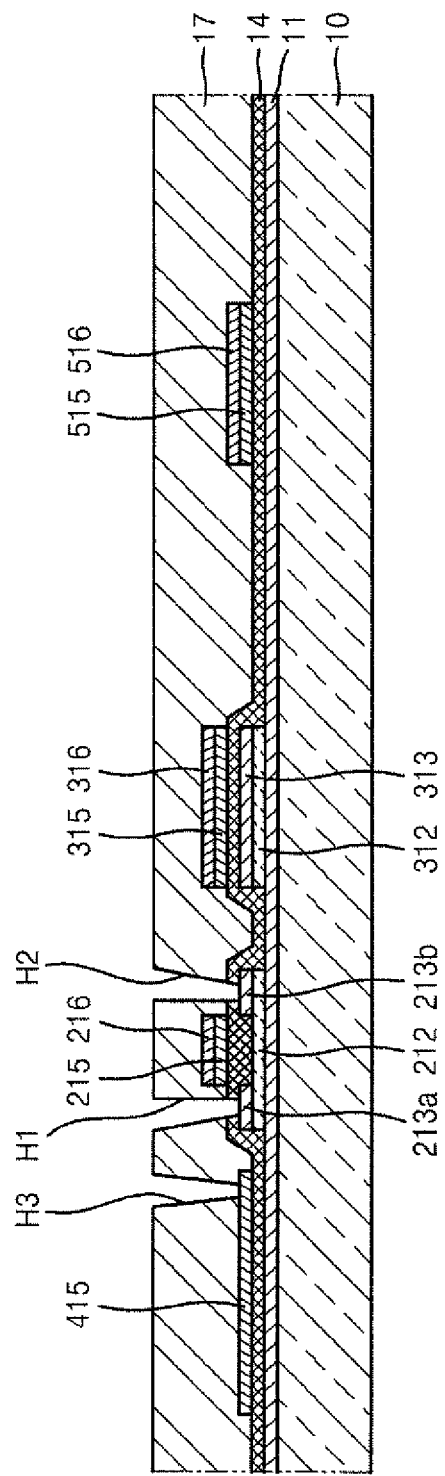

Referring to FIG. 11, the organic light emitting display device 1 is schematically illustrated after the exposed portions of the third photoresist layer P3 are removed and then etching is performed by using a remaining photoresist layer pattern as a mask. Holes H1, H2, and H3 exposing areas corresponding to the pixel electrode 415 and the source/drain areas 213a and 213b are formed.

Figure 12:
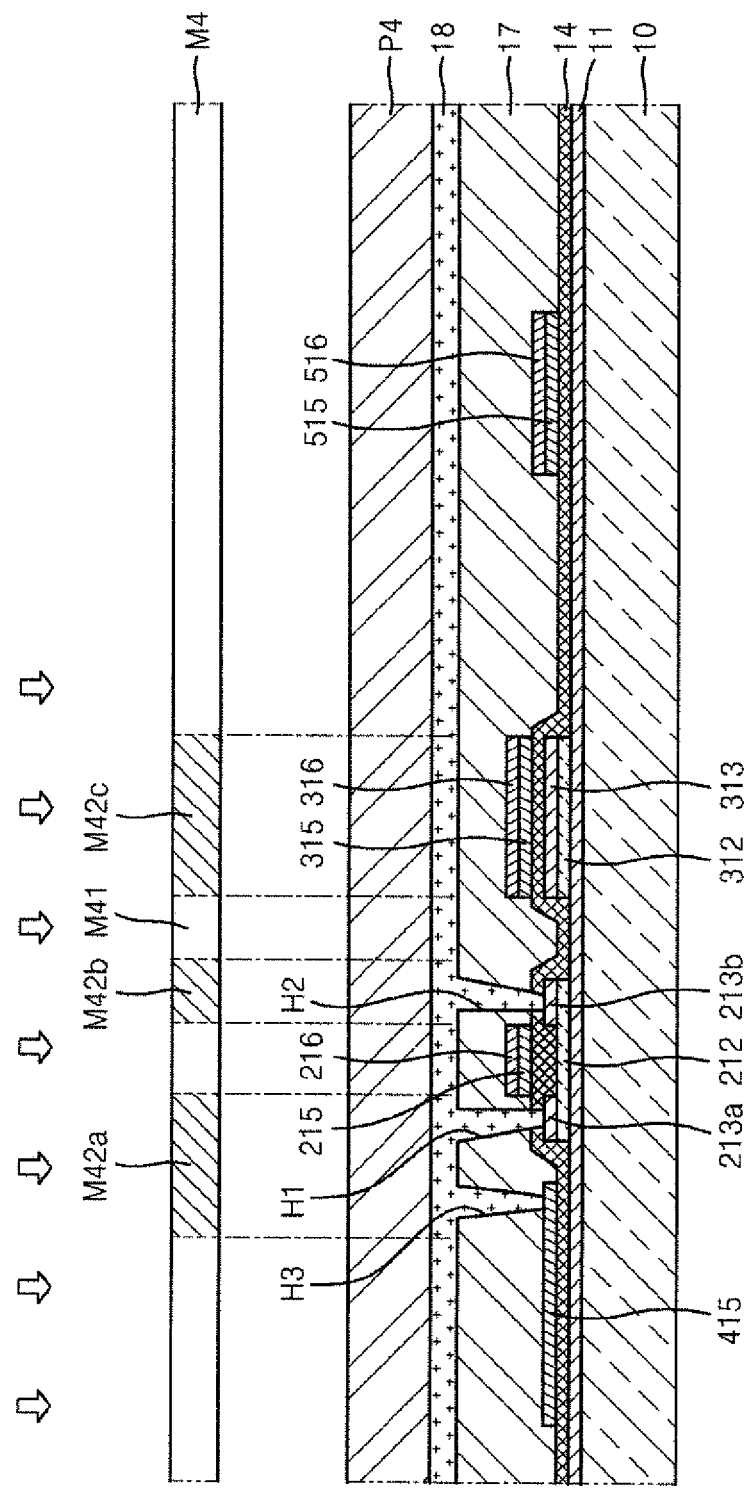
FIGS. 12 and 13 are cross-sectional views schematically illustrating the manufacturing process according to a fourth mask process of an organic light emitting display device according to an exemplary embodiment of the present invention.

Referring to FIG. 12, a fourth conductive layer 18 is formed on the structure of FIG. 11 that is a result of a third mask process. A fourth photoresist layer P4 is formed on the fourth conductive layer 18. A fourth mask M4 is aligned to the substrate 10.

The fourth conductive layer 18 may be formed of the same conductive material as that of the second or third conductive layer 15 or 16. The present invention is not limited thereto, and thus, the fourth conductive layer 18 may be formed of a variety of conductive materials. Also, the conductive material may be deposited with a sufficient thickness enough to fill the holes H1, H2, and H3.

The fourth mask M4 includes a light transmissive portion M41 and light shielding portions M42a, M42b, and M42c. After the fourth photoresist layer P4 is exposed and developed by using the fourth mask M4 having the above-described pattern, an etching process is performed by using a remaining photoresist layer pattern as a mask.

Referring to FIG. 13, as a result of a fourth mask process, source/drain electrodes 218a and 218b connected to the source/drain areas 213a and 213b via the holes H1, H2, and H3 are formed on the second insulation layer 17. The source and drain electrodes 218a and 218b contact the pixel electrode 415 by second electrode 218c via the hole H3 connected to the pixel electrode 415. Also, the third electrode 318 of the capacitor 3 is formed of the same material in the same layer as that of the source/drain electrodes 218a and 218b and second electrode 218c.

Figure 14:
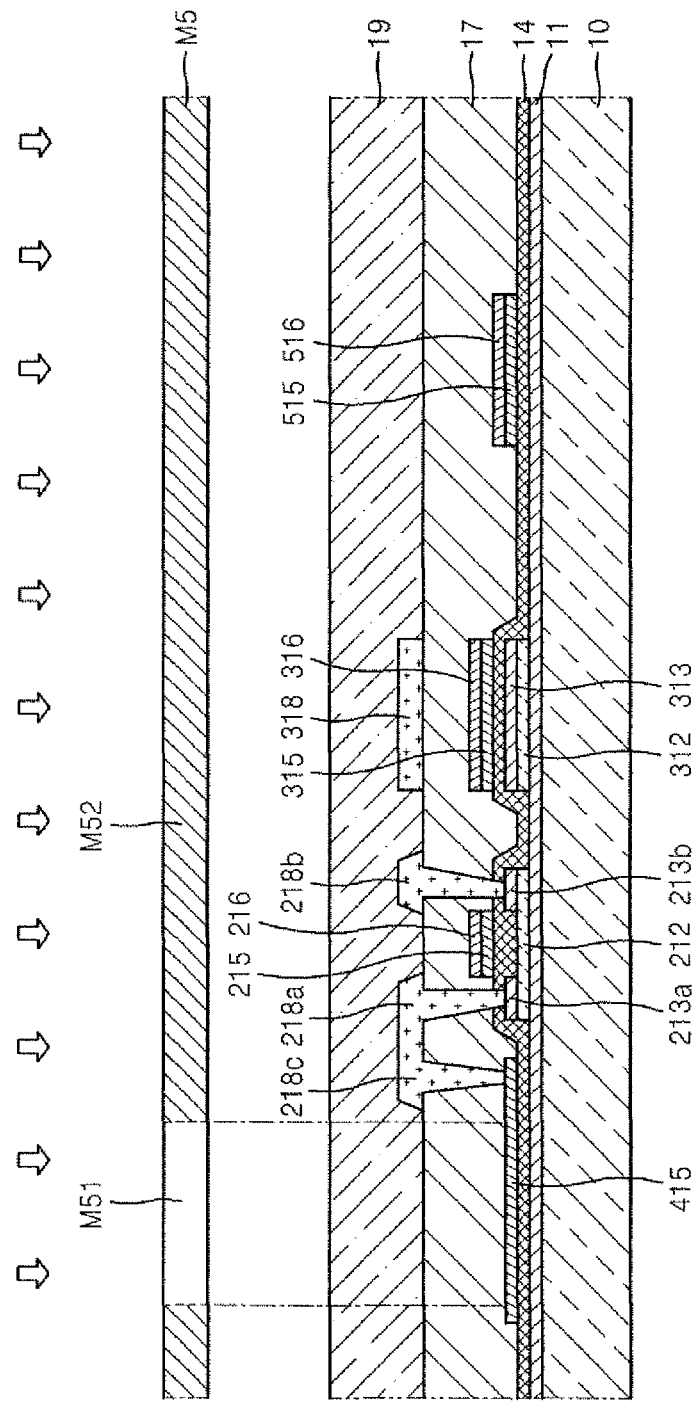
FIGS. 14 and 15 are cross-sectional views schematically illustrating the manufacturing process according to a fifth mask process of an organic light emitting display device according to an exemplary embodiment of the present invention.

Referring to FIG. 14, a third insulation layer 19 is formed on the structure of FIG. 13 that is a result of a fourth mask process. A fifth mask M5 is aligned to the substrate 10.

The third insulation layer 19 may be formed of at least one organic insulation material selected from a group consisting of polyimide, polyamide, acryl resin, benzocyclobutene, and phenol resin, by a spin coating method. The third insulation layer 19 may be formed of not only the organic insulation material but the inorganic insulation material used for the first and second insulation layers 14 and 17. The third insulation layer 19 functions as a pixel define layer (PDL) of an organic light emitting display device which will be described later, after an etching process using a fifth mask M5.

Figure 15:
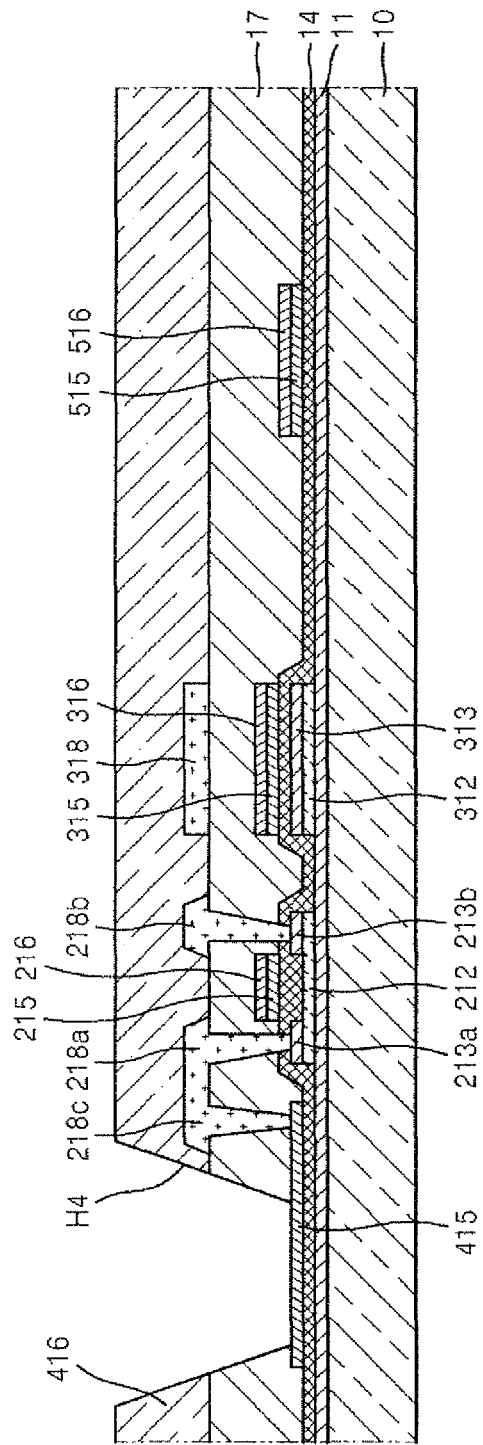

The fifth mask M5 includes a light transmissive portion M51 corresponding to the pixel electrode 415 and a light shielding portion M52 corresponding to the other area. When light is emitted to the fifth mask M5, the organic insulation material of the second and third insulation layers 17 and 19 to which light is emitted may be directly removed by dry etching (FIG. 15). Although in the above-described first through fourth mask processes the photoresist layer is exposed and developed and then the lower structure is patterned by using the developed photoresist layer as a mask, in the present embodiment in which the organic insulation material is used, the photoresist layer is not separately used and the third insulation layer 19 is directly dry-etched.

Referring to FIGS. 15 and 16, the second and third insulation layers 17 and 19 are etched so that a hole H4 may be formed to have the pixel electrode 415 exposed. Accordingly, a pixel define layer 416 for defining a pixel is formed. The pixel define layer 416 has a predetermined thickness so that the interval between the edge of the pixel electrode 415 and an opposite electrode 419 (FIG. 16) may be increased. Thus, a phenomenon that an electric field is concentrated on the edge of the pixel electrode 415 is prevented so that short circuit between the pixel electrode 415 and the opposite electrode 419 may be prevented.

Referring to FIG. 16, an intermediate layer 418 including an organic light emitting layer 417 and the opposite electrode 419 are formed on the pixel electrode 415 and the pixel define layer 416. The organic light emitting layer 417 emits light by the electric driving of the pixel electrode 415 and the opposite electrode 419. The organic light emitting layer 417 may be formed of a small molecule or polymer organic.

When the organic light emitting layer 417 is formed of a small molecule organic, in the intermediate layer 418, a hole transport layer (HTL) and a hole injection layer (HIL) may be deposited around the organic light emitting layer 417 in a direction toward the pixel electrode 415 and an electron transport layer (ETL) and an electron injection layer (EIL) may be deposited in a direction toward the opposite electrode 419.

Besides the above configuration, a variety of layers may be deposited as necessary. An available organic material may include copper phthalocyanine (CuPc), N,N-Di(naphthalene-1-yl)-N,N'-diphenyl-benzidine (NPB), and tris-8-hydroxyquinoline aluminum (Alq3).

When the organic light emitting layer 417 is formed of a polymer organic, in the intermediate layer 418, only the hole transport layer (HTL) may be included around the organic light emitting layer 417 in a direction toward the pixel electrode 415. The hole transport layer (HTL) may be formed above the pixel electrode 415 by an inkjet printing or spin coating method, by using poly-(2,4)-ethylene-dihydroxy thiophene (PEDOT) or polyaniline (PANI). As an available organic material, a poly-phenylenevinylene (PPV) based or polyfluorene based polymer organic may be used. A color pattern may be formed by a general method such as an inkjet printing or spin coating method or a thermal transfer method using laser.

The opposite electrode 419 that is a common electrode is deposited on the intermediate layer 418 including the organic light emitting layer 417. In the organic light emitting display device according to the present embodiment, the pixel electrode 415 is used as an anode electrode and the common electrode 419 is used as a cathode electrode. Also, the polarities of the electrodes may be reversed.

In the bottom emission type organic light emitting display device in which an image is formed toward the substrate 10, the pixel electrode 415 becomes a transparent electrode and the opposite electrode 419 becomes a reflection electrode. The reflection electrode may be formed by thinly depositing metal having a small work function, for example, Ag, Mg, Al, Pt, Pd, Au, Ni, Nd, Ir, Cr, Li, Ca, LiF/Ca, LiF/Al, or a compound thereof.

Although it is not illustrated in the drawings, a seal member (not shown) and a moisture absorbent (not shown) to protect the organic light emitting layer 417 from external moisture or oxygen may be further provided on the opposite electrode 419.

As described above, according to the organic light emitting display device according to the present invention, and the manufacturing method thereof, since the organic light emitting display device having the above-described structure is manufactured by using a small number of masks, manufacturing costs may be reduced due to the decrease in the number of masks and a simplified manufacturing process. Also, since the capacitor is formed of three electrodes and two dielectric layers, the capacity of the capacitor may be increased without increasing the size of the capacitor. Thus, decrease in the aperture ratio of the organic light emitting display device may be prevented. Furthermore, since the fanout is protected by two insulation layers, the fanout may be protected from the intrusion of moisture.

In detail, according to the organic light emitting display device according to the present invention, and the manufacturing method thereof, the fanout 5 is formed in the same layer as that of the gate lower and upper electrodes 215 and 216 of the TFT 2. In detail, according to a general organic light emitting display device and a manufacturing method thereof, a fanout is generally formed in the same layer as that of the source/drain electrodes 218a and 218b of FIG. 16. In this case, since the fanout is protected only by the pixel define layer 416, the fanout is highly likely to be exposed to moisture. When moisture intrudes into the fanout, the fanout is corroded so that a defect may be generated in a data line.

To solve the above problem, in the organic light emitting display device according to the present invention, and the manufacturing method thereof, the fanout 5 is formed in the same layer as that of the gate lower and upper electrodes 215 and 216 of the TFT 2.

The fanout 5 includes the lower electrode 515 formed from the second conductive layer 15 and the upper electrode 516 formed from the third conductive layer 16. As described above, the second conductive layer 15 may include at least one transparent material selected from a group consisting of ITO, IZO, ZnO, and In2P3. The third conductive layer 16 may include at least one material selected from a group consisting of Ag, Mg, Al, Pt, Pd, Au, Ni, Nd, Ir, Cr, Li, Ca, Mo, Ti, W, MoW, and Al/Cu. That is, the fanout 5 has a dual-layer structure of a transparent electrode and a metal electrode, or a multilayer structure.

When the fanout 5 is configured in the above method, since the fanout 5 is protected by two insulation layers of the second insulation layer 17, functioning as an interlayer insulation layer, and the third insulation layer 19, functioning as the pixel define layer 416, the fanout 5 may be protected from the intrusion of moisture. Furthermore, since the transparent material such as ITO, IZO, ZnO, and In2P3 forming the lower electrode 515 is not corroded, even if moisture intrudes into the fanout 5, short circuit may not be generated.

Although the organic light emitting display device is described as a flat display device in the present embodiment, the present invention is not limited thereto and a variety of display devices including liquid crystal displays may be used therefor. Also, a single TFT and a single capacitor are illustrated in the drawings to explain the present embodiment, this is merely for convenience of explanation and the present invention is not limited thereto. Thus, a plurality of TFTs and a plurality of capacitors may be included so long as the number of mask processes according to the present invention is not increased.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. An organic light emitting display device comprising:
    an active layer of a thin film transistor formed on a substrate;
    a first conductive layer separately formed at opposite edge portions of the active layer;
    a first insulation layer formed on the substrate and the first conductive layer;
    a second conductive layer formed to correspond to a central area of the active layer with the first insulation layer interposed therebetween;
    a fanout lower electrode separated a predetermined distance from the second conductive layer and formed of the same material in the same layer as that of the second conductive layer;
    a pixel electrode separated a predetermined distance from the second conductive layer and formed of the same material in the same layer as that of the second conductive layer;
    a third conductive layer formed on the second conductive layer;
    a fanout upper electrode formed on the fanout lower electrode and formed of the same material in the same layer as that of the third conductive layer;
    a second insulation layer formed on the third conductive layer, the fanout upper electrode, and the pixel electrode;
    source and drain electrodes contacting the pixel electrode and formed on the second insulation layer;
    a first lower electrode of a capacitor separated from a predetermined distance from the active layer and formed of the same material in the same layer as that of the active layer;
    a first upper electrode formed on the first lower electrode of the capacitor and formed of the same material in the same layer as that of the first conductive layer;
    a second lower electrode formed on the first upper electrode of the capacitor and formed of the same material in the same layer as that of the second conductive layer with the first insulation layer interposed therebetween; and
    a second upper electrode formed on the second lower electrode of the capacitor and formed of the same material in the same layer as that of the third conductive layer.

2. The organic light emitting display device of claim 1, the second conductive layer comprising at least one material selected from a group consisting of ITO (indium tin oxide), IZO (indium zinc oxide), ZnO (zinc oxide), and In2O3 (indium oxide).

3. The organic light emitting display device of claim 1, the third conductive layer comprising at least one material selected from a group consisting of Ag (silver), Mg (magnesium), Al (aluminum), Pt (platinum), Pd (palladium), Au (gold), Ni (nickel), Nd (neodymium), Ir (iridium), Cr (chromium), Li (litium), Ca (calcium), Mo (molybdenum), Ti (tin), W (tungsten), MoW (molybdenum-tungsten), and Al/Cu (aluminum/copper).

4. The organic light emitting display device of claim 1, further comprising a pixel define layer formed at an edge of the pixel electrode to have the pixel electrode exposed.

5. The organic light emitting display device of claim 1, the active layer being polycrystal silicon obtained by crystallizing amorphous silicon.

6. The organic light emitting display device of claim 1, the first conductive layer comprising impurity doped silicon.

7. The organic light emitting display device of claim 1, the end portions of the active layer and the first conductive layer being arrayed on the same plane and end portions of the first lower electrode and the first upper electrode of the capacitor being arrayed on the same plane.

8. The organic light emitting display device of claim 1, end portions of the second conductive layer and the third conductive layer being arrayed on the same plane, end portions of the lower electrode and the upper electrode of the fanout being arrayed on the same plane, and end portions of the second lower electrode and the second upper electrode of the capacitor being arrayed on the same plane.

9. The organic light emitting display device of claim 1, further comprising, on the pixel electrode, an intermediate layer including a light emitting layer and an opposite electrode formed on the intermediate layer.

10. The organic light emitting display device of claim 1, a thickness of the second insulation layer being thicker than that of the first insulation layer.

11. A method of manufacturing an organic light emitting display device, the method comprising:
    sequentially forming a semiconductor layer and a first conductive layer on and above a substrate and patterning the semiconductor layer and the first conductive layer into an active layer and source/drain areas of a thin film transistor, in a first mask process;
    forming a first insulation layer on a structure of the first mask process, sequentially forming a second conductive layer and a third conductive layer on and above the first insulation layer, and simultaneously patterning the first insulation layer, the second conductive layer, and the third conductive layer into a gate lower electrode and a gate upper electrode of the thin film transistor, a lower electrode and an upper electrode of a fanout, and a pixel electrode, in a second mask process;

forming a second insulation layer on a structure of the second mask process and removing the second insulation layer to have part of the source/drain areas and part of the pixel electrode exposed, in a third mask process;

forming a fourth conductive layer on a structure of the third mask process and patterning the fourth conductive layer into source/drain electrodes of the thin film transistor, in a fourth mask process; and forming a third insulation layer on a structure of the fourth mask process and removing the second insulation layer and the third insulation layer to have the pixel electrode exposed, in a fifth mask process.

12. The method of claim 11, the first lower electrode and the first upper electrode of a capacitor being simultaneously patterned, in the first mask process, with the active layer and the source/drain areas of the thin film transistor.

13. The method of claim 11, a first half-tone mask including a semi-transmissive portion formed at a position corresponding to the central portion of the active layer being used in the first mask process.

14. The method of claim 11, the second lower electrode and the second upper electrode of a capacitor being simultaneously patterned with the gate lower electrode and the gate upper electrode of the thin film transistor in the second mask process.

15. The method of claim 11, a second half-tone mask including a semi-transmissive portion formed at a position corresponding to the pixel electrode being used in the second mask process.

16. The method of claim 11, further comprising sequentially forming an intermediate layer including a light emitting layer, and an opposite layer, on a structure resulting from the fifth mask process.

17. The method of claim 11, the second conductive layer comprising at least one material selected from a group consisting of ITO (indium tin oxide), IZO (indium zinc oxide), ZnO (zinc oxide), and In2O3 (indium oxide).

18. The method of claim 11, the third conductive layer comprising at least one material selected from a group consisting of Ag (silver), Mg (magnesium), Al (aluminum), Pt (platinum), Pd (palladium), Au (gold), Ni (nickel), Nd (neodymium), Ir (iridium), Cr (chromium), Li (litium), Ca (calcium), Mo (molybdenum), Ti (tin), W (tungsten), MoW (molybdenum-tungsten), and Al/Cu (aluminum/copper).

19. The method of claim 11, further comprising forming a buffer layer on the substrate.

* * * * *